US011069690B2

(12) United States Patent
Yen et al.

(10) Patent No.: US 11,069,690 B2
(45) Date of Patent: Jul. 20, 2021

(54) DRAM AND FLASH STRUCTURE AND METHOD OF FABRICATING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Shih-Kuei Yen, Tainan (TW); Li-Wei Liu, Kaohsiung (TW); Le-Tien Jung, Tainan (TW); Hung-Lin Shih, Hsinchu (TW); Hsuan-Tung Chu, Tainan (TW); Ming-Che Li, New Taipei (TW); Guan-Yi Liou, Chiayi County (TW); Huai-Jin Hsing, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/145,164

(22) Filed: Sep. 28, 2018

(65) Prior Publication Data

US 2020/0083228 A1   Mar. 12, 2020

(30) Foreign Application Priority Data

Sep. 7, 2018   (CN) .......................... 201811042392.2

(51) Int. Cl.
*H01L 27/108*   (2006.01)
*H01L 27/11519*   (2017.01)
*H01L 27/11551*   (2017.01)
*H01L 27/11526*   (2017.01)

(52) U.S. Cl.
CPC .... *H01L 27/10897* (2013.01); *H01L 27/1085* (2013.01); *H01L 27/10823* (2013.01); *H01L 27/10876* (2013.01); *H01L 27/10885* (2013.01); *H01L 27/10888* (2013.01); *H01L 27/11519* (2013.01); *H01L 27/11526* (2013.01); *H01L 27/11551* (2013.01)

(58) Field of Classification Search
None
See application file for complete search history.

(56) References Cited

U.S. PATENT DOCUMENTS

| 5,492,858 | A | 2/1996 | Bose |
| 5,901,095 | A | 5/1999 | Crafts |
| 6,965,538 | B1 * | 11/2005 | Parks ................... G11C 17/165 |
| | | | 365/189.09 |
| 7,163,869 | B2 | 1/2007 | Kim |
| 8,149,622 | B2 | 4/2012 | Lee |
| 9,299,568 | B2 | 3/2016 | Jenne |
| 2006/0001104 | A1 * | 1/2006 | Ookura ............. H01L 21/76224 |
| | | | 257/368 |

(Continued)

*Primary Examiner* — Dung A. Le
(74) *Attorney, Agent, or Firm* — Winston Hsu (57) ABSTRACT

A flash includes a substrate comprising an active region and two electron storage structures disposed at two sides of the active region, wherein each of the electron storage structures comprises a silicon oxide/silicon nitride/silicon oxide composite layer. A buried gate is embedded in the active region, wherein the buried gate only consists of a control gate and a gate dielectric layer, and the gate dielectric layer is formed by a single material. Two source/drain doping regions are disposed in the active region at two sides of the buried gate.

8 Claims, 12 Drawing Sheets

(56) References Cited

U.S. PATENT DOCUMENTS

| | | | |
|---|---|---|---|
| 2006/0220144 A1* | 10/2006 | Anezaki | H01L 21/76227 257/374 |
| 2007/0012992 A1* | 1/2007 | Kim | H01L 29/42336 257/316 |
| 2007/0138545 A1* | 6/2007 | Lin | H01L 27/10876 257/330 |
| 2008/0137399 A1 | 6/2008 | Chan | |
| 2015/0061001 A1* | 3/2015 | Ikeda | H01L 29/4236 257/331 |
| 2015/0270337 A1* | 9/2015 | Ujihara | H01L 21/76229 257/510 |
| 2016/0276476 A1* | 9/2016 | Fang | H01L 29/4236 |

* cited by examiner

DRAM AND FLASH STRUCTURE AND METHOD OF FABRICATING THE SAME

BACKGROUND OF THE INVENTION

1. Field of the Invention

The present invention relates to a method of fabricating a DRAM and a flash on a same substrate, and a method of using a silicon oxide/silicon nitride/silicon oxide composite layer as a filling of a shallow trench isolation.

2. Description of the Prior Art

Memory can be divided into volatile memory such as a dynamic random access memory (DRAM) or a non-volatile memory such a flash.

Each DRAM unit comprises a MOS transistor and at least a capacitor, wherein the MOS transistor and the capacitor are connected in series with each other. By using a word line and a bit line, a DRAM can be read and programmed. A flash memory is a non-volatile solid state memory that does not need power to maintain data stored in the memory. This feature makes flash memory a popular storage solution for a variety of devices, such as removable storage cards and cell phones.

As electrical products become lighter, thinner, shorter and smaller, flash memories and DRAMs are being scaled down to match the trends of high integration and high density. Therefore, a new design of structure and fabricating method is needed to form flash memories and DRAMs with smaller sizes and better performance.

SUMMARY OF THE INVENTION

According to a preferred embodiment of the present invention, a flash includes a substrate comprising an active region and two electron storage structures disposed at two sides of the active region, wherein each of the electron storage structures comprises a silicon oxide/silicon nitride/silicon oxide composite layer. A buried gate is embedded in the active region, wherein the buried gate consists of a control gate and a gate dielectric layer, and the gate dielectric layer is formed by a single material. Two source/drain doping regions are disposed in the active region at two sides of the buried gate.

According to another preferred embodiment of the present invention, a DRAM includes a substrate comprising an active region and two shallow trench isolations respectively disposed at two sides of the active region, wherein each of the two shallow trench isolations comprises a silicon oxide/silicon nitride/silicon oxide composite layer. A gate structure is embedded in the active region. Two source/drain doping regions are disposed in the active region at two sides of the gate structure. A capacitor electrically connects to one of the two source/drain doping regions.

A method of fabricating a DRAM and a flash includes providing a substrate comprising a first region and a second region, wherein the first region is for disposing a DRAM, and the second region is for disposing a flash. Next, numerous trenches are formed in the first region and the second region to define a first active region in the first region and a second active region in the second region. Later, a silicon oxide/silicon nitride/silicon oxide composite layer is formed to fill in the trenches to form numerous shallow trench isolations. After that, a first buried gate crossing the first active region and a second buried gate crossing the second active region are formed, wherein the second buried gate only consists of a control gate and a gate dielectric layer, the gate dielectric layer is formed by a single material. Subsequently, a capacitor plug is formed to contact the first active region and is disposed at one side of the first buried gate. Finally, a capacitor is formed to electrically connect the capacitor plug.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 depict a method of fabricating a DRAM and a flash according to a preferred embodiment of the present invention, wherein:

DETAILED DESCRIPTION

FIG. 1 to FIG. 13 depict a method of fabricating a DRAM and a flash according to a preferred embodiment of the present invention. Example (a) in FIG. 2 shows a sectional view taken along line AA' in FIG. 1. Example (b) in FIG. 2 shows a sectional view taken along line BB' in FIG. 1. Example (c) in FIG. 2 shows a modification of Example (a) and Example (b).

Figure 1:
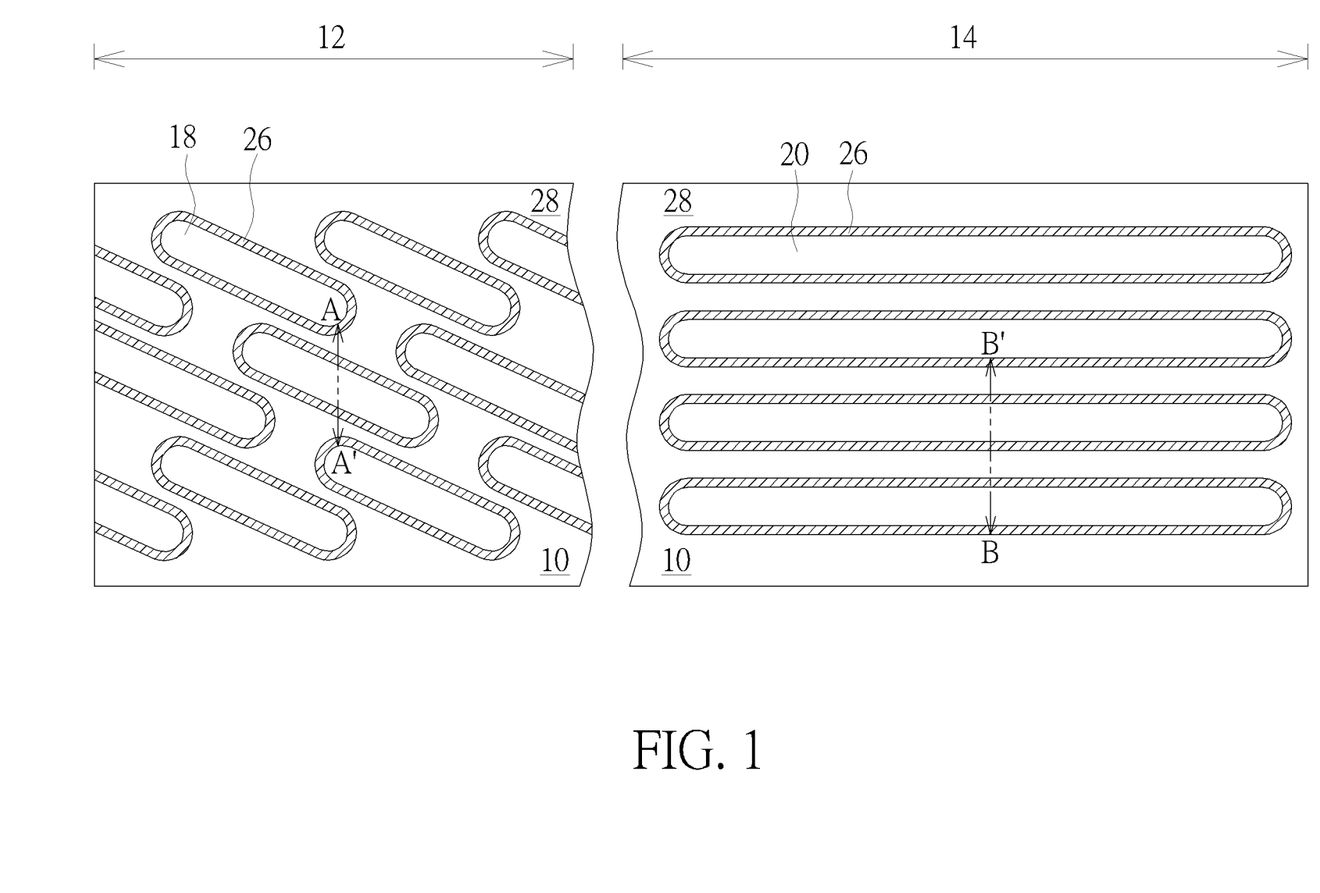
FIG. 1 depicts a top view of a first region and a second region.
Figure 2:
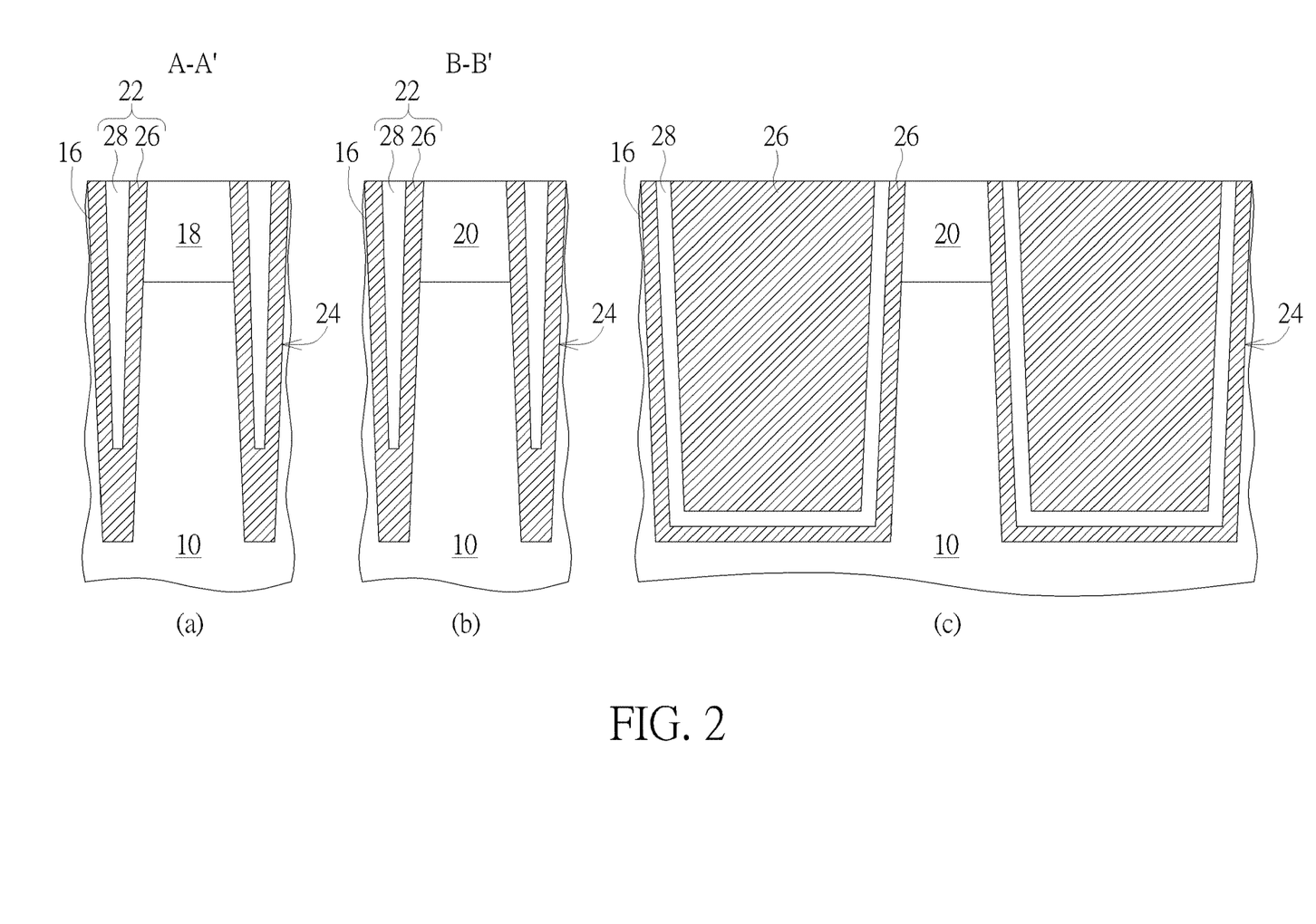
FIG. 2 shows Example (a), Example (b) and Example (c) which respectively depict sectional views in FIG. 1.

As shown in FIG. 1, a substrate 10 is provided. The substrate 10 is divided into a first region 12 and a second region 14. The first region 12 is used for forming at least one dynamic random access memory (DRAM): for example, a DRAM array. The second region 14 is used to form at least one flash: for example, a flash array. The substrate 10 may be a silicon substrate, a germanium substrate, a gallium arsenide substrate, a silicon germanium substrate, an indium phosphide substrate, a gallium nitride substrate or a silicon carbide substrate.

Refer to FIG. 1 and FIG. 2. The substrate 10 is etched to form numerous trenches 16 in the first region 12 and the second region 14. The trenches 16 define numerous first active regions 18 in the first region 12, and numerous second active regions 20 in the second region 14. Later, a silicon oxide/silicon nitride/silicon oxide composite layer 22 is formed to fill in the trenches 16 to form numerous shallow trench isolations (STIs) 24. The method of forming the silicon oxide/silicon nitride/silicon oxide composite layer 22 may vary based on the size of the opening of each trench 16. When the size of the opening of each trench 16 is smaller, the method of forming the silicon oxide/silicon nitride/silicon oxide composite layer 22 includes forming a silicon oxide layer 26 conformally covering a sidewall and a bottom of each of the trenches 16, the first active region 18 and the second active region 20. At this point, the center of each of the trenches 16 is still empty. Later, a silicon nitride layer 28 is formed to fill up the center of each trench 16 and cover the first active region 18 and the second active region 20. Subsequently, a planarization process is performed to planarize the silicon oxide layer 26 and the silicon nitride layer 28 and make the top surface of the silicon oxide layer 26 and the top surface of the silicon nitride layer 28 align with the top surface of the substrate 10. As shown in Example (a) and Example (b) in FIG. 2, the silicon oxide layer 26 and the silicon nitride layer 28 form the silicon oxide/silicon nitride/silicon oxide composite layer 22 in each of the trenches 16 under a cross-sectional view. According to another preferred embodiment of the present invention, as shown in Example (c) in FIG. 2, when the size of the opening 16 is larger, the steps of forming the silicon oxide layer 26 and the silicon nitride layer 28 can be repeated until the trenches 16 are filled up. As shown in the Example (c) in FIG. 2, the silicon oxide layer 26 is formed followed by forming the silicon nitride layer 28. Later, another silicon oxide layer 26 is formed again, and the trenches 16 are filled up. At this point, the silicon oxide/silicon nitride/silicon oxide composite layer 22 is formed in each of the trenches 16 under a cross-sectional view. In this embodiment, before forming the silicon oxide/silicon nitride/silicon oxide composite layer 22, a liner (not shown) can be optionally formed in each of the trenches 16. The linear can be a thin silicon oxide.

According to another preferred embodiment, the silicon nitride layer in the silicon oxide/silicon nitride/silicon oxide composite layer 22 can be replaced by high-k materials. The high-k materials may be $Al_2O_3$, $ZrO_2$, barium strontium titanate (BST), lead zirconate titanate (PZT), $ZrSiO_2$, $HfSiO_2$, HfSiON, $TaO_2$, and the like. According to yet another embodiment, the silicon nitride layer in silicon oxide/silicon nitride/silicon oxide composite layer 22 can be combined with the high-k materials mentioned above.

Figure 3:
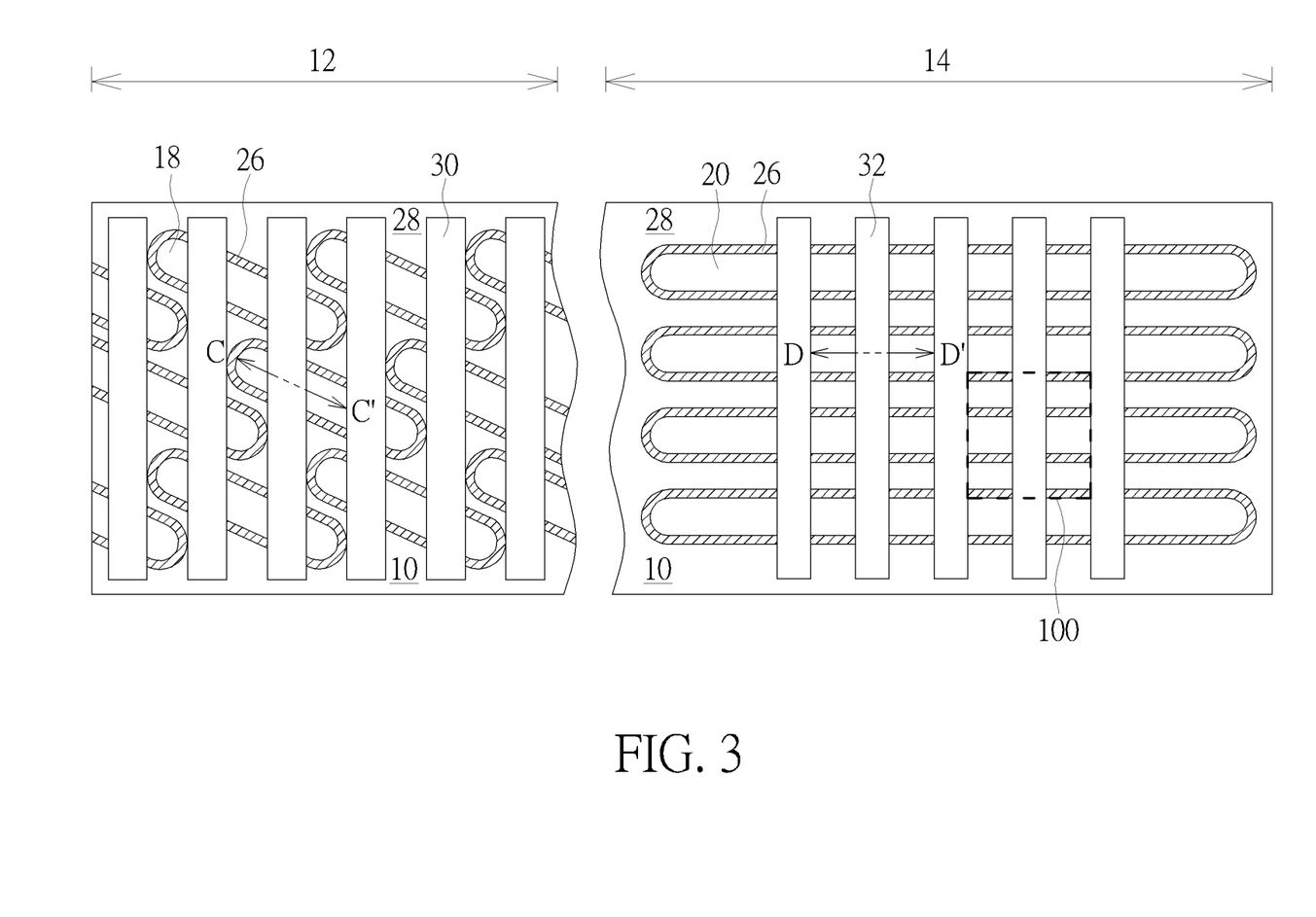
FIG. 3 depicts a top view of a fabricating stage subsequent to FIG. 1.
Figure 4:
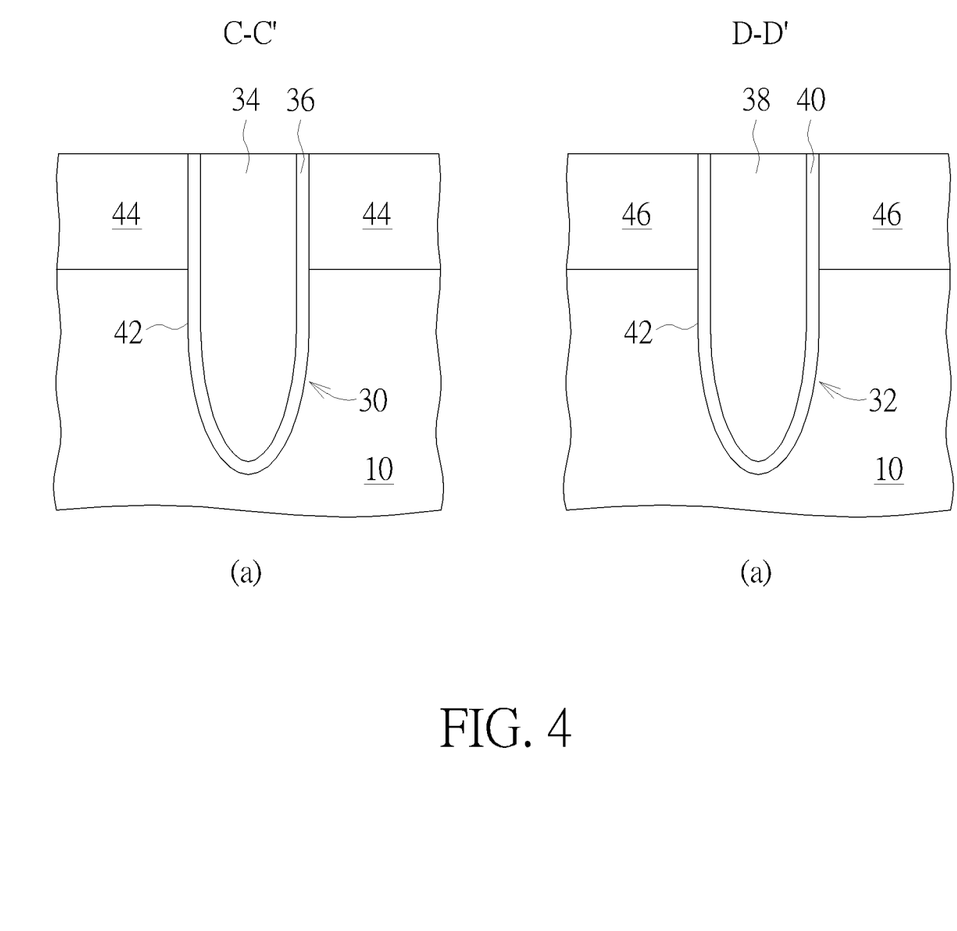
FIG. 4 depicts a sectional view taken along line CC' and line DD' in FIG. 3.

FIG. 4 depicts a sectional view taken along line CC' and line DD' in FIG. 3. Refer to FIG. 3 and FIG. 4. Numerous first buried gates 30 crossing the first active region 18 and numerous second buried gates 32 crossing the second active region 20 are formed. Each of the first buried gates 30 includes a gate electrode 34 and a gate dielectric layer 36. Each of the second buried gates 32 only consists of a control gate 38 and a gate dielectric layer 40. The gate dielectric layer 40 is formed by a single material. The fabricating steps of the first buried gates 30 and the second buried gates 32 include forming numerous gate trenches 42 simultaneously. Later, if the first buried gates 30 and the second buried gates 32 have the same structure, a dielectric layer and a conductive layer are simultaneously filled in the trenches 42 in the first region 12 and the second region 14. The dielectric layer and the conductive layer in the first region 12 respectively serve as the gate dielectric layer 36 and the gate electrode 34 of the DRAM. The dielectric layer and the conductive layer in the second region 14 respectively serve as the gate dielectric layer 40 and the control gate 38 of a flash. The gate dielectric layers 36/40 may be silicon oxide. The control gate 38 and the gate electrode 34 may be doped polysilicon or metal. According to another preferred embodiment of the present invention, the structures of the first buried gates 30 and the second buried gates 32 may be different: for example, different widths, different depths or different gate electrode materials. The fabricating steps of the first buried gate 30 and the second buried gate 32 with different structures include forming the gate dielectric layer 36 and the gate electrode 34 in the first region 12. Then, the gate dielectric layer 40 and the control gate 38 in the second region 14 can be formed. In other embodiments, the gate dielectric layer 40 and the control gate 38 in the second region 14 can be formed before forming the gate dielectric layer 36 and the gate electrode 34 in the first region 12. After forming the first buried gates 30 and the second buried gates 32, two first source/drain doping regions 44 are formed at two sides of each of the first buried gates 30 in the first active region 18. Two second source/drain doping regions 46 are formed at two sides of each of the second buried gates 32 in the second active region 14. The conductive types of the first source/drain doping regions 44 and the second source/drain doping regions 46 can be the same or different.

Figure 5:
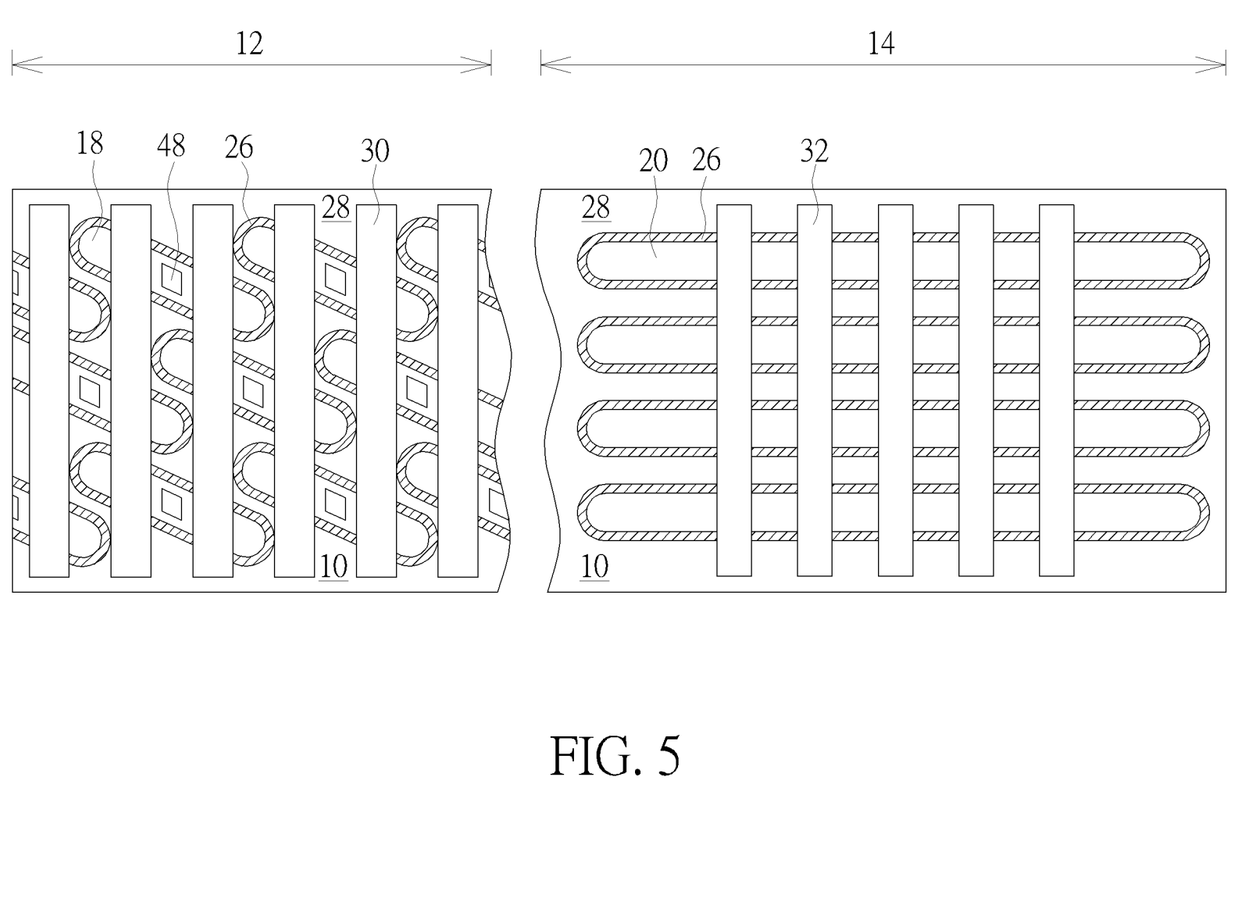
FIG. 5 depicts a top view of a fabricating stage subsequent to FIG. 3.

As shown in FIG. 5, a dielectric layer (not shown) is formed in the first region 12. Later a mask layer (not shown) is formed to cover the second region 14 and expose part of the first region 12. After that, at least one bit line contact plug 48 contacting one of the first source/drain doping regions 44 disposed at one side of each of the first buried gates 30 in the first active region 18 is formed. In this embodiment, numerous bit line contact plugs 48 are formed for example. After forming the bit line contact plugs 48, the mask layer is removed. The bit line contact plugs 48 may be metal, alloy, doped polysilicon or other conductive materials.

Figure 6:
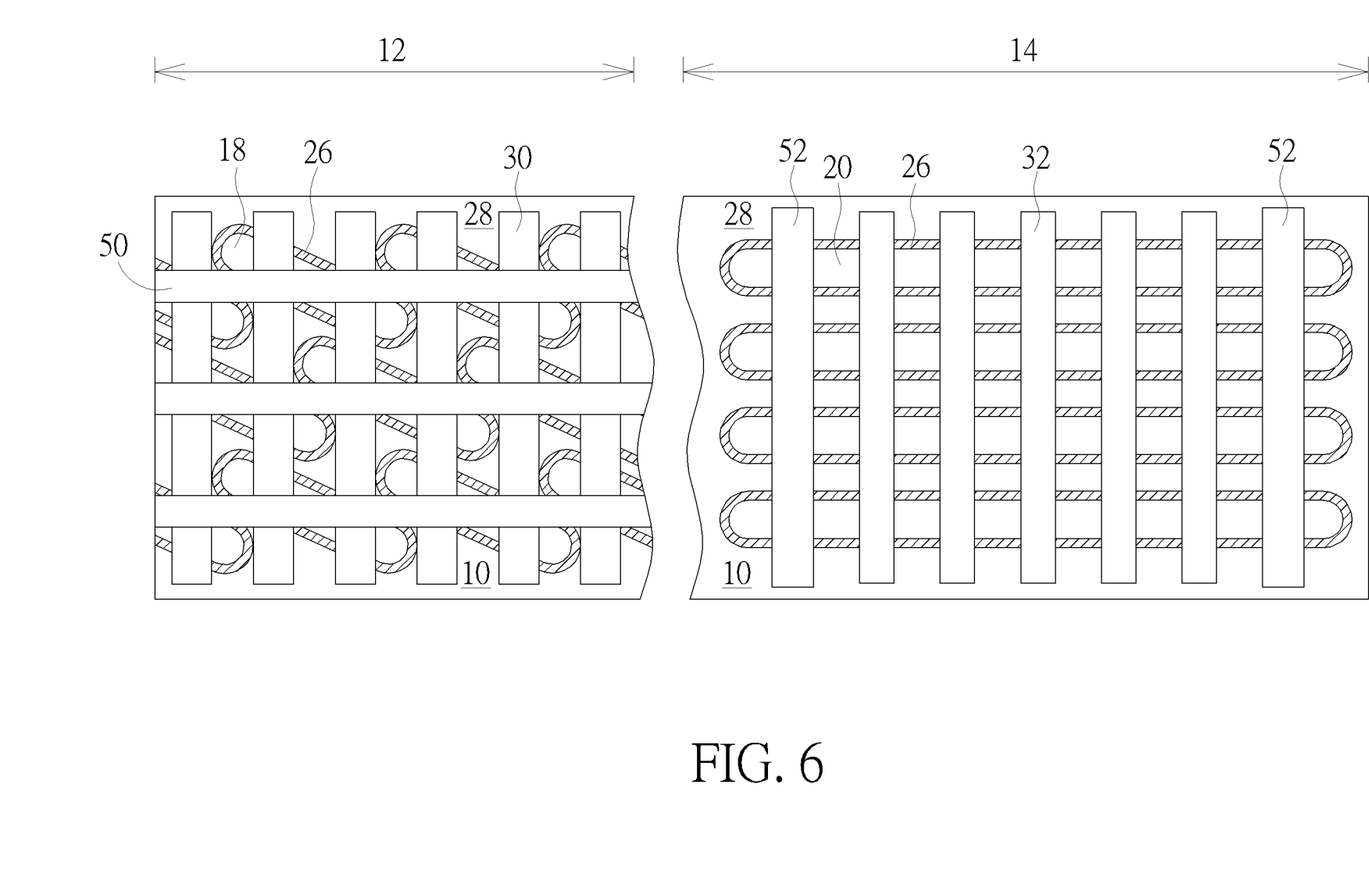
FIG. 6 depicts a top view of a fabricating stage subsequent to FIG. 5.
Figure 7:
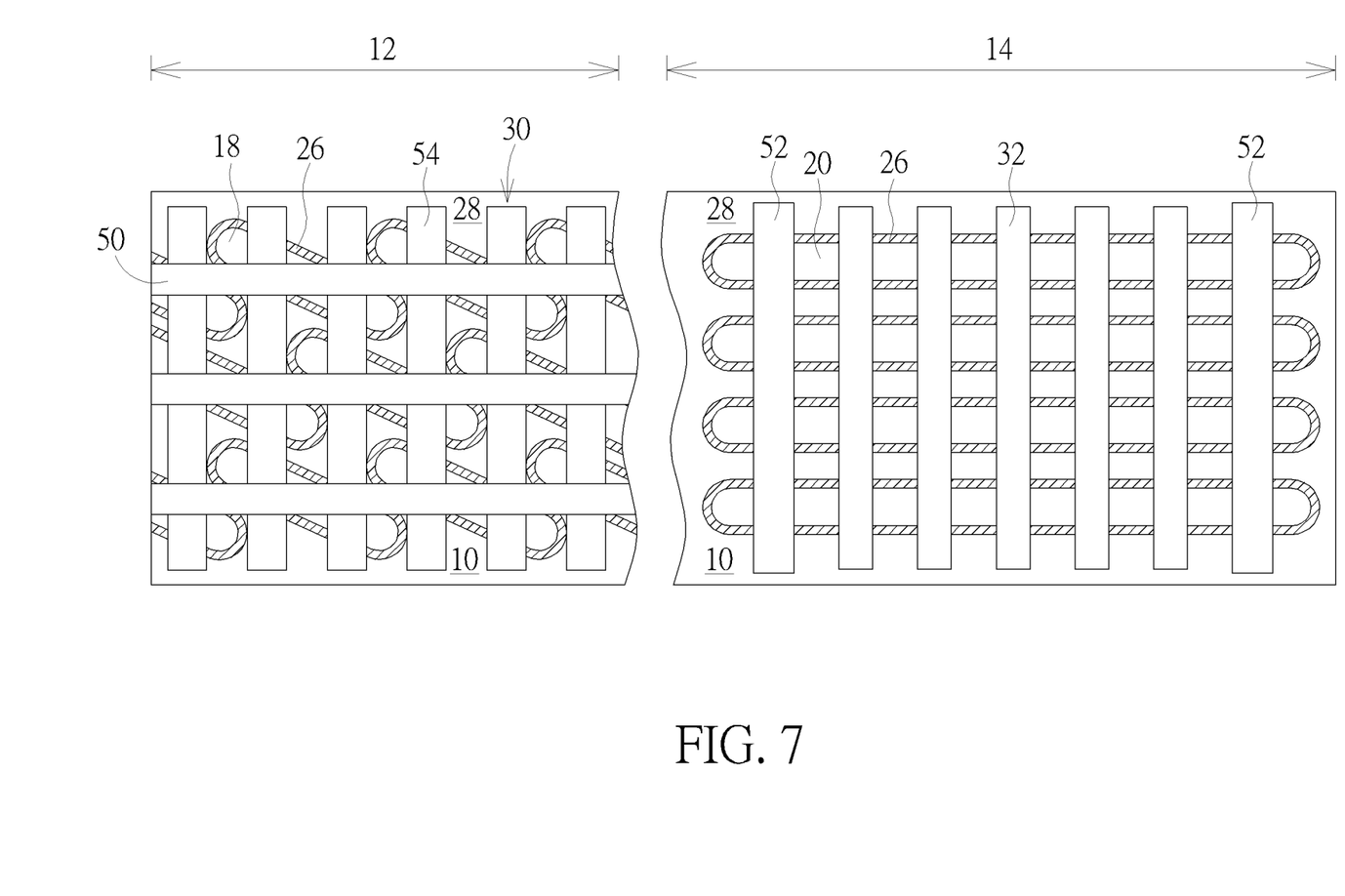
FIG. 7 depicts a top view of a fabricating stage subsequent to FIG. 6.
Figure 8:
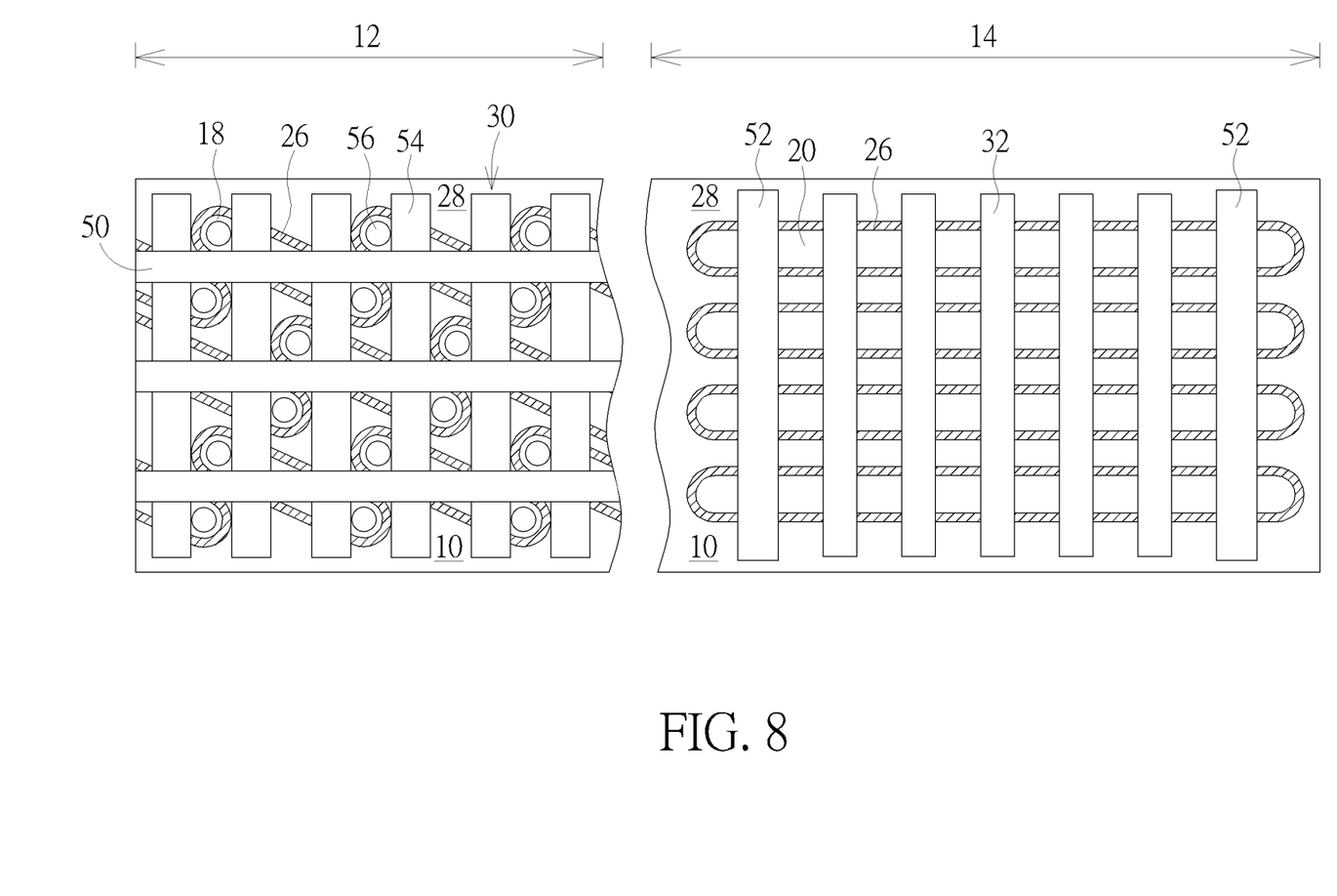
FIG. 8 depicts a top view of a fabricating stage subsequent to FIG. 7.

As shown in FIG. 6, another mask layer (not shown) is formed to cover part of the first region 12 and part of the second region 14. Then, numerous bit line gates 50 in the first region 12 and numerous switch lines 52 in the second region 14 are formed simultaneously. This embodiment takes two switch lines 52 as example, but is not limited to this. Based on different layouts, the numbers of the switch lines 52 can be varied. Each of the bit line gates 50 respectively contacts and electrically connects to numerous bit line contact plugs 48. Each of the switch lines 52 respectively contacts and electrically connects to numerous second active regions 20. The bit line gates 50 and the switch lines 52 may be metal, alloy, doped polysilicon or other conductive materials. As shown in FIG. 7, a mask layer (not shown) is formed to cover the second region 14 and expose the first region 12. Then, a dielectric layer 54 is formed directly on each of the first buried gates 30 in the first region 12. The dielectric layer 54 may be silicon oxide, silicon nitride or other insulating materials. As shown in FIG. 8, capacitor plugs 56 are respectively formed on the first source/drain doping regions 44 which do not have the bit line contact plug thereon 48 (please refer to FIG. 4 for the position of the first source/drain doping regions 44). The capacitor plug 54 may be metal, alloy, doped polysilicon or other conductive materials. Later, the mask layer formed in FIG. 7 is removed.

Figure 9:
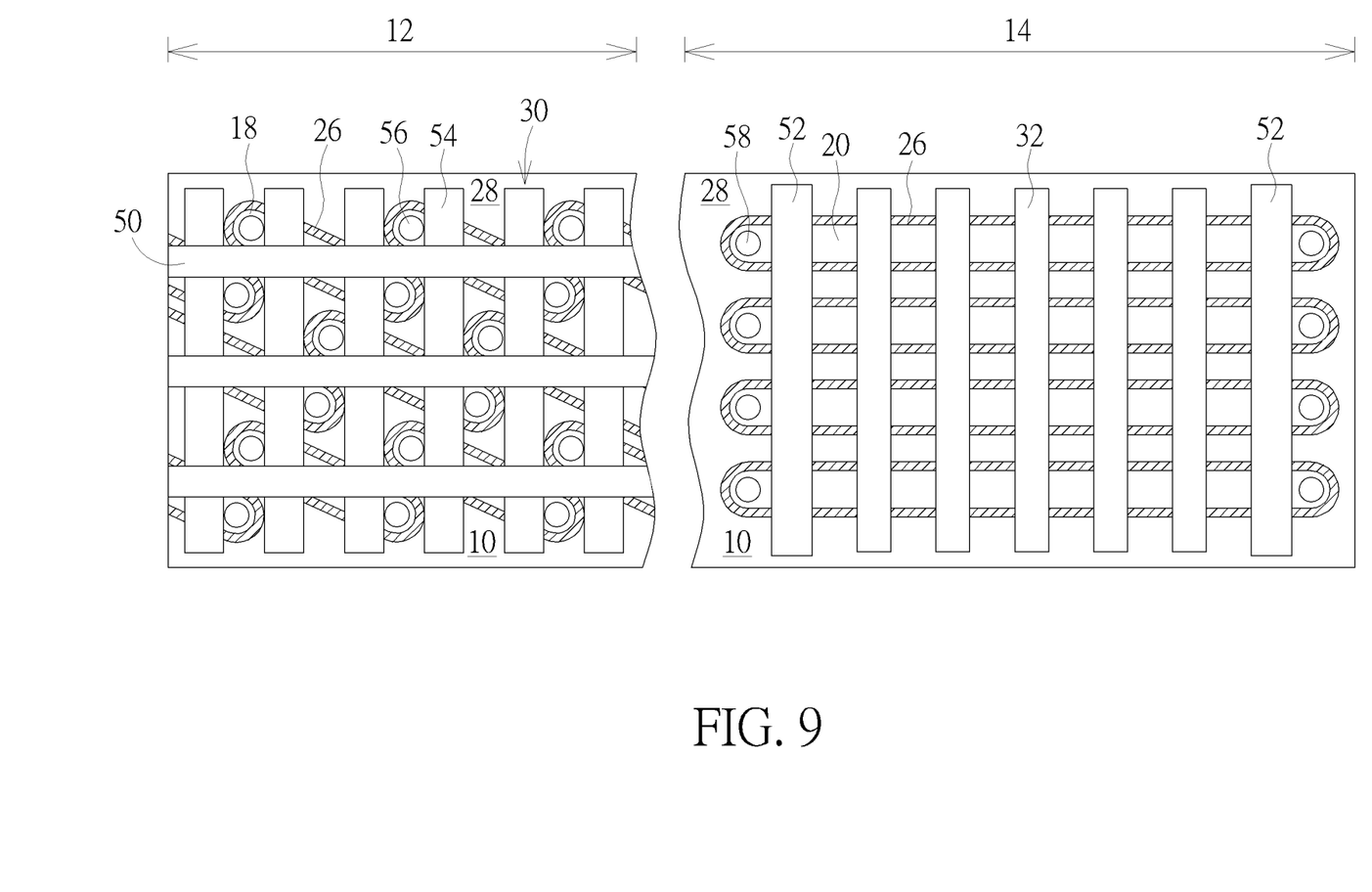
FIG. 9 depicts a top view of a fabricating stage subsequent to FIG. 8.
Figure 10:
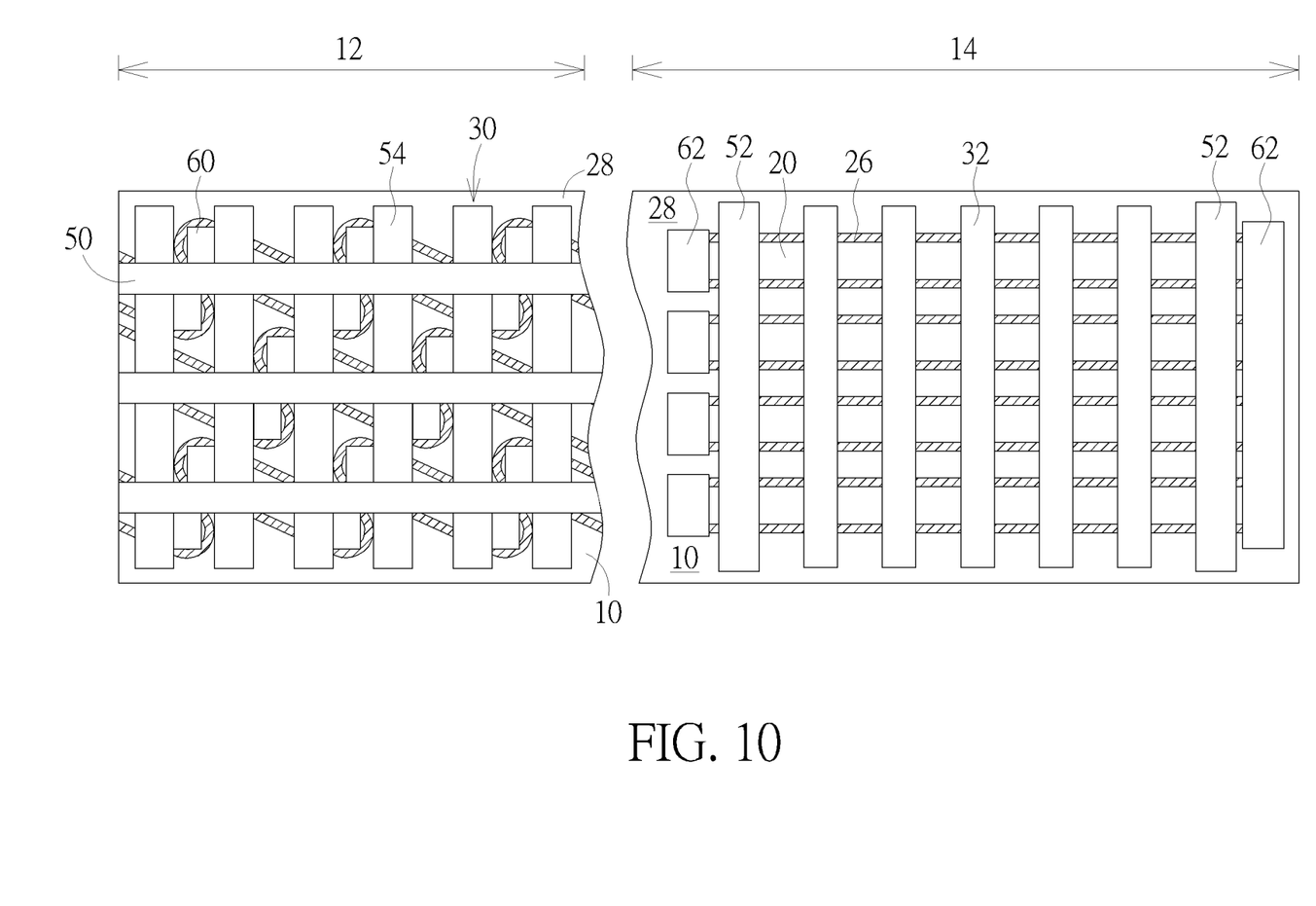
FIG. 10 depicts a top view of a fabricating stage subsequent to FIG. 9.
Figure 11:
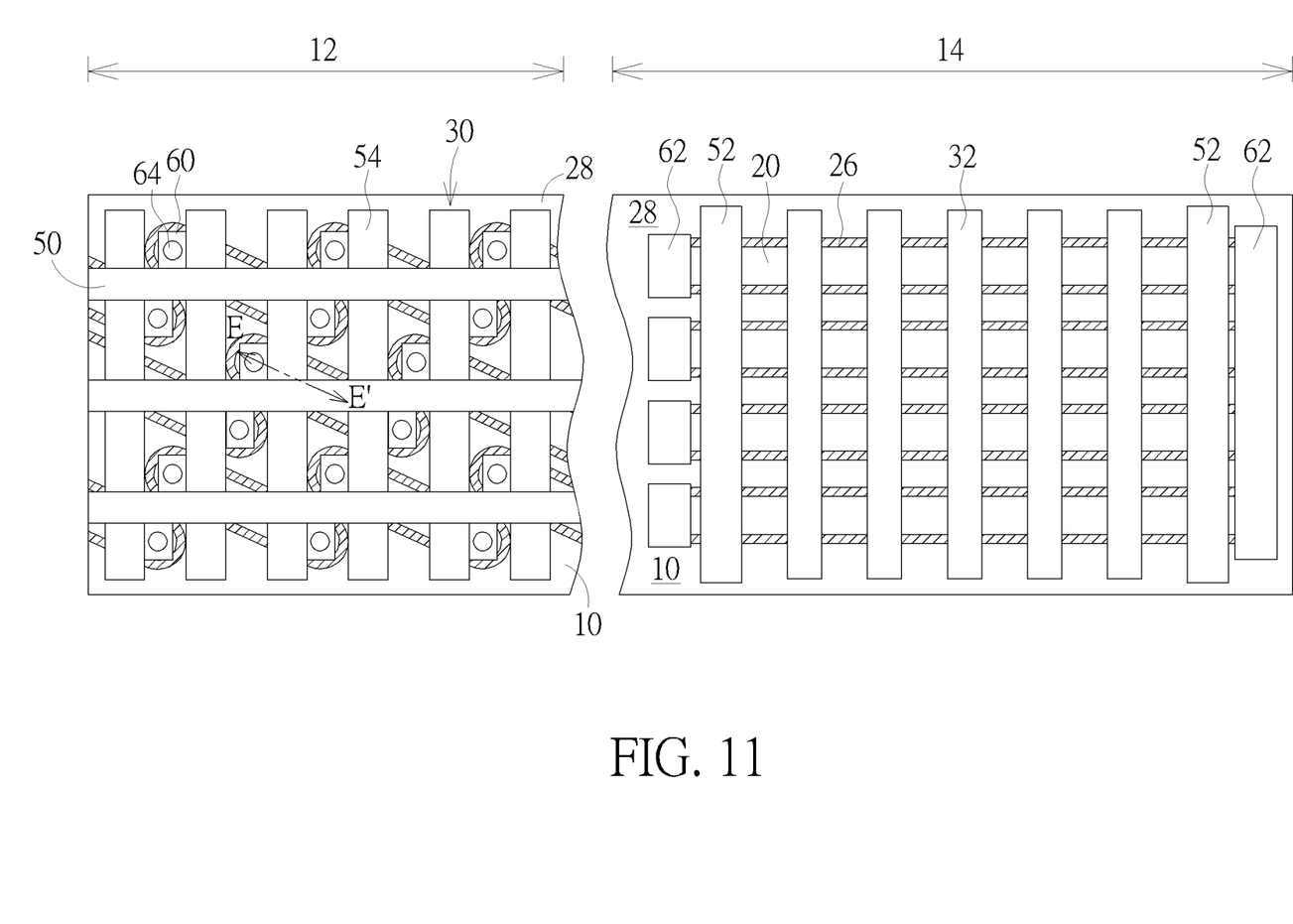
FIG. 11 depicts a top view of a fabricating stage subsequent to FIG. 10.

As shown in FIG. 9, a dielectric layer (not shown) is formed in the second region 14. Then, numerous peripheral circuit contact plugs 58 are formed to respectively contact an end of each of the active regions 20. According to another preferred embodiment of the present invention, numerous peripheral circuit contact plugs (not shown) outside of the first region 12 and the second region 14 are formed on the substrate 10 at the same time as the peripheral circuit contact plugs 58 are formed. As shown in FIG. 10, another dielectric layer (not shown) is formed. Later, numerous capacitor contact pads 60 and numerous peripheral circuit contact pads 62 are simultaneously formed in the dielectric layer. The capacitor contact pads 60 are in the first region 12. The peripheral circuit contact pads 62 are in the second region 14. The capacitor contact pads 60 and the peripheral circuit contact pads 62 may independently be metal, alloy, doped polysilicon or other conductive materials. Each of the capacitor contact pads 60 respectively contacts a capacitor plug 56. Some of the peripheral circuit contact pads 62 respectively contact the corresponding peripheral circuit contact plugs 58. At least one of the peripheral circuit contact pads 62 simultaneously contacts numerous peripheral circuit contact plugs 58. As shown in FIG. 11, a mask layer (not shown) is formed to cover the second region 14 and expose the first region 12. Later, numerous capacitors 64 are formed in the first region 12 to respectively contact one capacitor contact pad 60. Each of the capacitors 64 electrically connects to the capacitor plug 56 through the capacitor contact pad 60. Each of the capacitors 64 includes a top electrode, a bottom electrode, and a capacitor dielectric layer disposed between the top electrode and the bottom electrode. At this point, the method of fabricating a DRAM and a flash of the present invention is completed.

Figure 12:
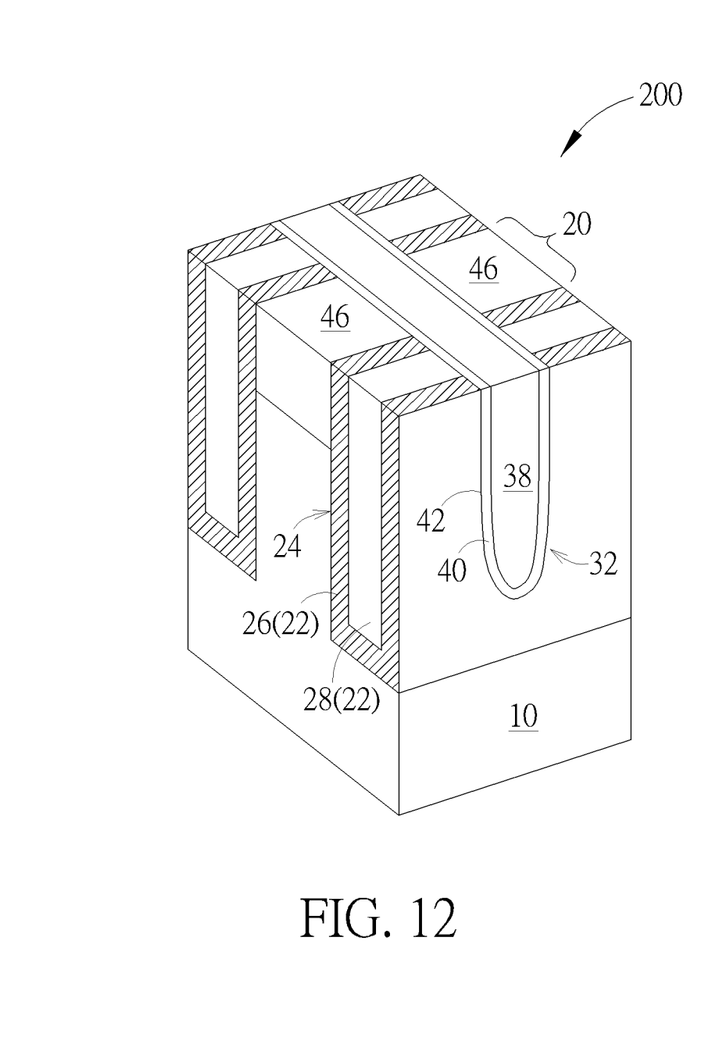
FIG. 12 depicts a three-dimensional view of the region 100 in FIG. 3.

The method of fabricating a DRAM and a flash of the present invention includes forming a DRAM and a flash. FIG. 12 depicts a three-dimensional view of the region 100 shown in FIG. 3. As shown in FIG. 12 and Example (b) of FIG. 4, a flash 200 of the present invention includes the second active region 20 on the substrate 10, and two STIs 24 disposed at two sides of the second active region 20. The two STIs 24 serve as two electron storage structures for the flash 200. Each of the STIs 24 includes a silicon oxide/silicon nitride/silicon oxide composite layer 22. The second buried gate 32 is embedded in the second active region 20. The second buried gate 32 only consists of the control gate 38 and the gate dielectric layer 40. The gate dielectric layer 40 is made of a single material. Two second source/drain doping regions 46 are disposed in the second active region 20 at two sides of the second buried gate 32. During a programming stage, electrons pass the control gate 38, penetrate the gate dielectric layer 40 and enter the two STIs (i.e. electron storage structures) 24, wherein the electrons are stored in the silicon nitride layer of two electron storage structures. During an erase stage, electron holes pass through the control gate 38, penetrate the gate dielectric layer 40, and enter the electron storage structures to neutralize the electrons in the two electron storage structures. During a programming stage, the voltage of the control gate 38 is −6 volts. The voltage of the two second source/drain doping regions 46 are both 0 volt. The voltage of the substrate 10 is 0 volt. During an erasing stage, the voltage of the control gate 38 is 6 volts. The voltage of the two second source/drain doping regions 46 are both 0 volt. The voltage of the substrate 10 is 0 volt. During a reading stage, the voltage of the control gate 38 is 0 to 1.5 volts. The voltage of the source of the second source/drain doping regions is 0 volt. The voltage of the drain of the second source/drain doping regions is 1 volt. The voltage of the substrate 10 is −0.7 volts.

Conventionally, the electron storage structure of a flash is stacked directly under the control gate. The advantage of the present invention is that the STIs 24 serve as two electron storage structures for the flash 200. Therefore, the gate dielectric layer 40 directly under the control gate 38 only consists of a single material rather than a silicon oxide/silicon nitride/silicon oxide composite material. That is, the gate dielectric layer of the flash in the present invention is thinner than the gate dielectric layer of the conventional flash. In this way, during forming the gate dielectric layer 40, the fabricating difficulty can be reduced, and the size of the buried gate can be decreased.

Figure 13:
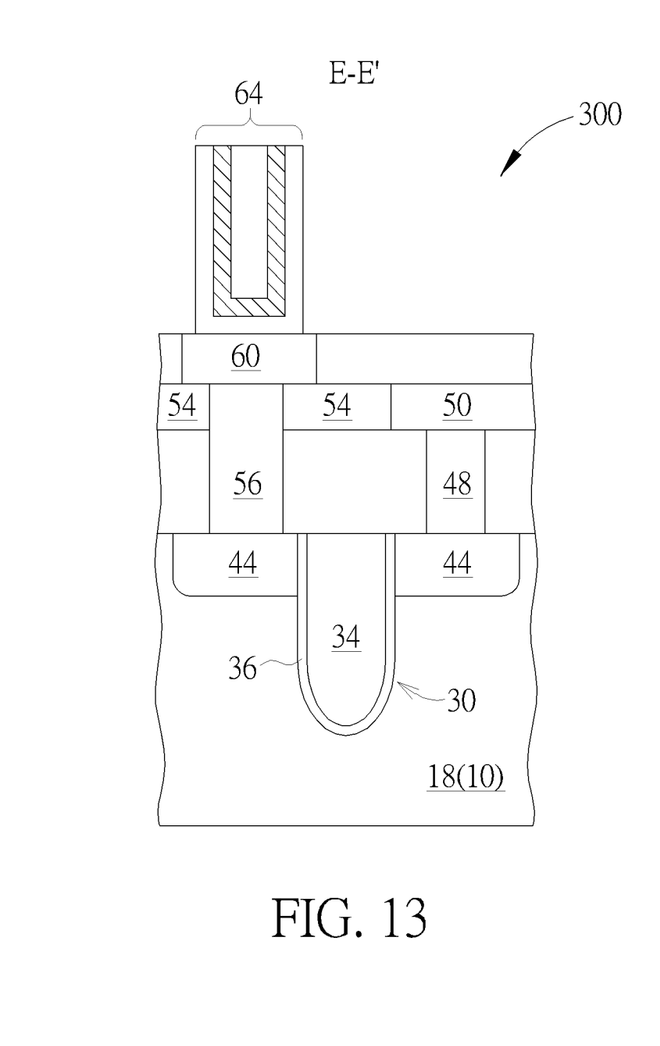
FIG. 13 depicts a sectional view taken along line EE' in FIG. 11.

FIG. 13 depicts a sectional view taken along line EE' in FIG. 11. As shown in FIG. 1, FIG. 11 and FIG. 13, a DRAM 300 of the present invention includes the first active region 18 on the substrate 10. Two STIs 24 are disposed at two sides of the first active region 18. Each of the STIs 24 includes the silicon oxide/silicon nitride/silicon oxide composite layer 22. The first buried gate 30 is embedded in the first active region 18. The first buried gate 30 includes the gate structure 34 and the gate dielectric layer 36. Two first source/drain doping regions 44 are respectively disposed in the first active region 30 at two sides of the first buried gate 30. The bit line contact plug 48 contacts one of the first source/drain doping regions 44. The capacitor plug 56 contacts another first source/drain doping region 44. The bit line gate 50 is disposed on the bit line contact plug 48. The capacitor contact pad 60 is disposed on the capacitor plug 56. The capacitor contact pad 60 electrically connects to the capacitor plug 56. The capacitor 64 is disposed on the capacitor contact pad 60. The capacitor 64 electrically connects to one of the first source/drain doping regions 44 through the capacitor plug 56. Each DRAM has a threshold voltage. Conventionally, the threshold voltage is adjusted by implanting dopants into the first active region. The threshold voltage adjusted by this conventional method has limitations, however. Therefore, the present invention provides a novel method to adjust the threshold voltage. In the method of the present invention, the threshold voltage is adjusted by storing electrons in a silicon oxide/silicon nitride/silicon oxide composite layer of the STIs 24. The method of the present invention is usually performed after the formation of a DRAM is completed, and the threshold voltage can be adjusted based on the performance of the completed DRAM. The method of the present invention can be performed individually or combined with the conventional method. According to a preferred embodiment of the present invention, the positive electrons can be stored in STIs 24 under the condition that the voltage of gate electrode 34 is 6 volts, the voltage of the two first source/drain doping regions is 0 volt and the voltage of the substrate 10 is 0 volt. The negative electrons can be stored in STIs 24 under the condition that the voltage of gate electrode 34 is −6 volts, the voltage of the two first source/drain doping regions is 0 volt and the voltage of the substrate 10 is 0 volt.

The present invention provides a method of fabricating a flash and a DRAM on the same substrate. Moreover, the silicon oxide/silicon nitride/silicon oxide composite layer in the STIs is used as electrode storage structures of the flash. Furthermore, the threshold voltage of the DRAM can be adjusted by storing electrons in the STIs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a DRAM and a flash, comprising:
  providing a substrate comprising a first region and a second region, wherein the first region is for disposing a DRAM, and the second region is for disposing a flash;
  forming a plurality of trenches in the first region and the second region to define a first active region in the first region and a second active region in the second region;
  forming a silicon oxide/silicon nitride/silicon oxide composite layer filling in the trenches to form a plurality of shallow trench isolations;
  forming a first buried gate crossing the first active region and a second buried gate crossing the second active region, wherein the second buried gate only consists of a control gate and a gate dielectric layer, the gate dielectric layer is formed by a single material;
  forming a capacitor plug contacting the first active region and disposed at one side of the first buried gate; and
  forming a capacitor electrically connecting the capacitor plug.

2. The method of fabricating a DRAM and a flash of claim 1, further comprising:
  after forming the first buried gate and the second buried gate, forming two first source/drain doping regions in the first active region at two sides of the first buried gate, forming two second source/drain doping regions in the second active region at two sides of the second buried gate.

3. The method of fabricating a DRAM and a flash of claim 2, wherein the shallow trench isolations, the second buried gate and the two second source/drain doping regions form a flash, and the first buried gate, the two first source/drain doping regions, and the capacitor form a DRAM.

4. The method of fabricating a DRAM and a flash of claim 3, wherein a threshold voltage of the DRAM is adjusted by storing electrons in each of the shallow trench isolations.

5. The method of fabricating a DRAM and a flash of claim 3, wherein during a programing stage of the flash, electrons pass the control gate, penetrate the gate dielectric layer and enter each of the shallow trench isolations and the electrons are stored in the each of the shallow trench isolations.

6. The method of fabricating a DRAM and a flash of claim 1, further comprising:
  after forming the first buried gate and the second buried gate, and before forming the capacitor plug, forming a bit line contact plug contacting the first active region and at another side of the first buried gate;
  simultaneously forming a bit line gate in the first region and a switch line in the second region, the bit line gate contacting the bit line contact plug, and the switch line contacting the second active region; and
  after forming the bit line gate, forming a dielectric layer directly on the first buried gate.

7. The method of fabricating a DRAM and a flash of claim 1, further comprising:
  after forming the capacitor plug, forming a peripheral circuit plug contacting the second active region; and
  before forming the capacitor, simultaneously forming a capacitor contact pad in the first region and a peripheral circuit contact pad in the second region, wherein the capacitor contact pad contacts the capacitor plug and the peripheral circuit contact pad contacts the peripheral circuit plug.

8. The method of fabricating a DRAM and a flash of claim 7, wherein the capacitor contacts the capacitor contact pad.

* * * * *